United States Patent
Matsumura

(10) Patent No.: US 10,098,226 B2
(45) Date of Patent: Oct. 9, 2018

(54) PRINTED WIRING BOARD

(71) Applicant: FUJIKURA LTD., Tokyo (JP)

(72) Inventor: Kazutoshi Matsumura, Tokyo (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 15/515,510

(22) PCT Filed: Sep. 25, 2015

(86) PCT No.: PCT/JP2015/077144
§ 371 (c)(1),
(2) Date: Mar. 29, 2017

(87) PCT Pub. No.: WO2016/052346
PCT Pub. Date: Apr. 7, 2016

(65) Prior Publication Data
US 2017/0231087 A1 Aug. 10, 2017

(30) Foreign Application Priority Data
Sep. 30, 2014 (JP) .................. 2014-199682

(51) Int. Cl.
H05K 1/09 (2006.01)
H05K 1/02 (2006.01)
(Continued)

(52) U.S. Cl.
CPC ........... *H05K 1/0298* (2013.01); *H05K 1/188* (2013.01); *H05K 3/4007* (2013.01);
(Continued)

(58) Field of Classification Search
CPC .......... H05K 1/188; H05K 3/36; H05K 3/361; H05K 3/363; H05K 3/4617;
(Continued)

(56) References Cited

U.S. PATENT DOCUMENTS 5,799,392 A * 9/1998 Mishiro ................. H05K 3/361
29/830
6,093,477 A * 7/2000 Matsufusa .............. G06F 3/044
428/131
(Continued)

FOREIGN PATENT DOCUMENTS

JP 01-002453 U1 1/1989
JP 04-077134 U1 7/1992
(Continued)

OTHER PUBLICATIONS

Office Action in corresponding Japanese Patent Applicantion No. 2014-199682 dated May 31, 2016 (8 pages).
(Continued)

Primary Examiner — Chau N Nguyen
Assistant Examiner — Roshn Varghese
(74) Attorney, Agent, or Firm — Osha Liang LLP

(57) ABSTRACT

A printed wiring board includes an insulating sheet, a conductive layer formed on one main surface of the insulating sheet, and an insulating film laminated with an adhesive layer on the main surface of the insulating sheet formed with the conductive layer. The position of an end part of the insulating film is located outside the position of an end part of the adhesive layer.

8 Claims, 6 Drawing Sheets

(51) Int. Cl.
*H05K 1/18* (2006.01)
*H05K 3/40* (2006.01)
*H05K 3/46* (2006.01)
*H01L 21/02* (2006.01)
*H01L 21/3213* (2006.01)

(52) U.S. Cl.
CPC ...... *H05K 3/4644* (2013.01); *H01L 21/02068* (2013.01); *H01L 21/32136* (2013.01); *H05K 2201/094* (2013.01)

(58) Field of Classification Search
CPC ... H05K 2203/0143; H05K 2203/0522; H05K 2201/0195; H05K 2201/05; H05K 2201/0183
See application file for complete search history.

(56) References Cited

U.S. PATENT DOCUMENTS

| | | | | |
|---|---|---|---|---|
| 6,252,176 | B1* | 6/2001 | Kuramochi | H05K 1/024 |
| | | | | 174/254 |
| 6,395,993 | B1* | 5/2002 | Nakamura | H05K 3/4617 |
| | | | | 174/254 |
| 6,449,836 | B1* | 9/2002 | Miyake | H05K 3/361 |
| | | | | 174/263 |
| 2003/0102152 | A1* | 6/2003 | Kneisel | H05K 3/445 |
| | | | | 174/255 |
| 2007/0137141 | A1 | 6/2007 | Petersen et al. | |
| 2009/0315855 | A1 | 12/2009 | Oikawa et al. | |
| 2010/0307797 | A1* | 12/2010 | Watanabe | H05K 1/0281 |
| | | | | 174/254 |
| 2015/0382454 | A1* | 12/2015 | Su | H05K 1/118 |
| | | | | 174/254 |

FOREIGN PATENT DOCUMENTS

| | | |
|---|---|---|
| JP | 2001-284794 A | 10/2001 |
| JP | 2003-258402 A | 9/2003 |
| JP | 2004-235459 A | 8/2004 |
| JP | 2005-268416 A | 9/2005 |
| JP | 2008-277717 A | 11/2008 |
| JP | 2010/003749 A | 1/2010 |
| JP | 2010/287595 A | 12/2010 |
| JP | 2011/249549 A | 12/2011 |
| JP | 2012-169688 A | 9/2012 |
| TW | 201330727 A | 7/2013 |

OTHER PUBLICATIONS

Office Action issued in corresponding Taiwanese Application No. 104132021 dated Aug. 25, 2017 (12 pages).

* cited by examiner

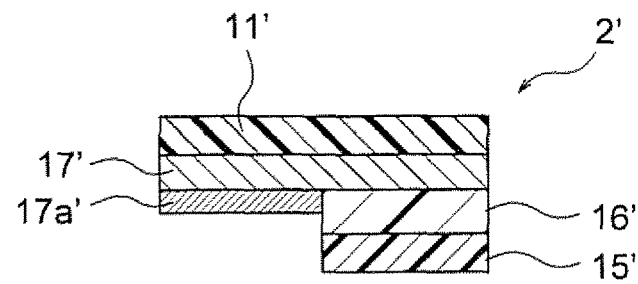
FIG.4(A)
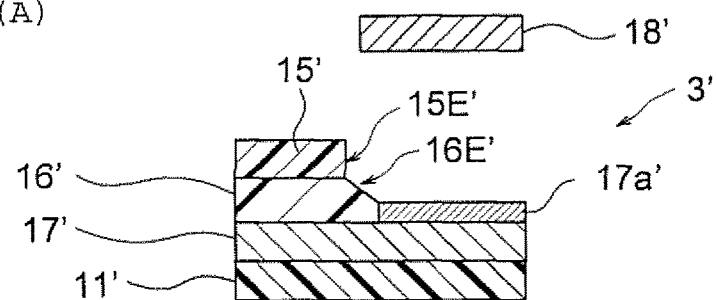
FIG.4(B)
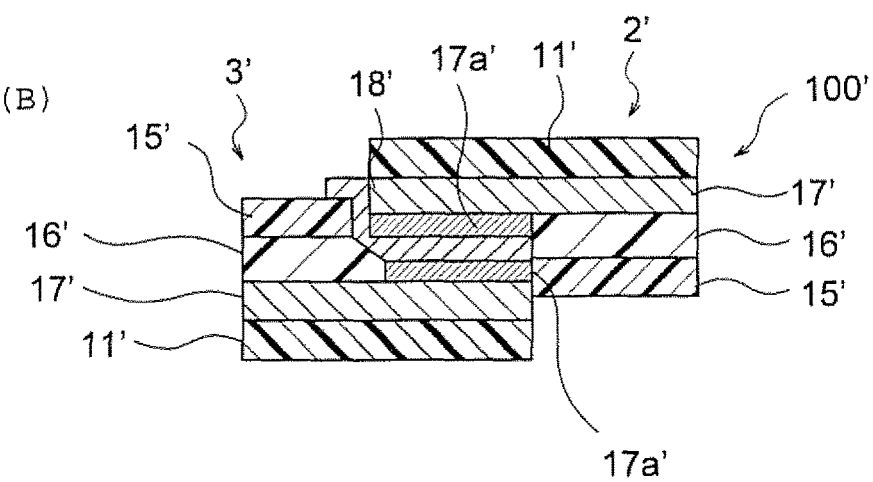

PRINTED WIRING BOARD

The contents of Patent Application No. 2014-199682, filed with Japan Patent Office on Sep. 30, 2014, are incorporated herein by reference in the designated countries in which the incorporation by reference is accepted.

TECHNICAL FIELD

The present invention relates to a printed wiring board.

BACKGROUND ART

A printed wiring board is known which is configured such that an adhesive layer for attaching a reinforcement plate to a board main body protrudes outside than the reinforcement plate (Patent Document 1).

PRIOR ART DOCUMENT

Patent Document

[Patent Document 1] JP2010-287595A

SUMMARY OF INVENTION

Problems to be Solved by Invention

However, there may be a problem in that the protruding adhesive layer comes into contact with another physical body and breaks and the broken pieces adhere to the printed wiring board as foreign materials.

Problems to be solved by the present invention include providing a highly-reliable printed wiring board that prevents the breakage of an adhesive layer and also prevents the occurrence of foreign materials due to the breakage of an adhesive layer.

Means for Solving Problems (1) The present invention solves the above problems by providing a printed wiring board comprising: a first insulating substrate; a conductive layer formed on one main surface of the first insulating substrate; and a second insulating substrate laminated with an adhesive layer on the main surface of the first insulating substrate, wherein a position of an end part of the second insulating substrate is located outside than a position of an end part of the adhesive layer.

(2) In the above invention, the above problems are solved by setting a distance from the end part of the adhesive layer to the end part of the second insulating substrate to be 0.8 times or more and 20 times or less a thickness of the adhesive layer.

(3) In the above invention, the above problems are solved by setting the distance from the end part of the adhesive layer to the end part of the second insulating substrate to be 10 [μm] or more and 500 [μm] or less.

(4) In the above invention, the above problems are solved by configuring the conductive layer formed on the one main surface of the first insulating substrate to have a second surface that is a surface at an opposite side to a first surface of the conductive layer in contact with the first insulating substrate and configuring the second surface to include an exposed surface that is exposed within a region located outside than the position of the end part of the adhesive layer.

(5) In the above invention, the above problems are solved by electrically connecting the conductive layer to another conductive layer provided at another printed wiring board.

(6) In the above invention, the above problems are solved by disposing an anisotropic conductive layer between the conductive layer and the other conductive layer.

Effect of Invention

According to the present invention, a printed wiring board can be provided having a structure in which breakage of the adhesive layer is less likely to occur. A highly-reliable printed wiring board can thus be provided which prevents the occurrence of foreign materials due to the breakage of the adhesive layer.

BRIEF DESCRIPTION OF DRAWINGS

FIG. 4(A) and FIG. 4(B) are views for describing an example of using a printed wiring board according to a comparative example.

MODE(S) FOR CARRYING OUT THE INVENTION

First Embodiment

A first embodiment of the present invention will be described below with reference to the drawings.

Figure 1A:
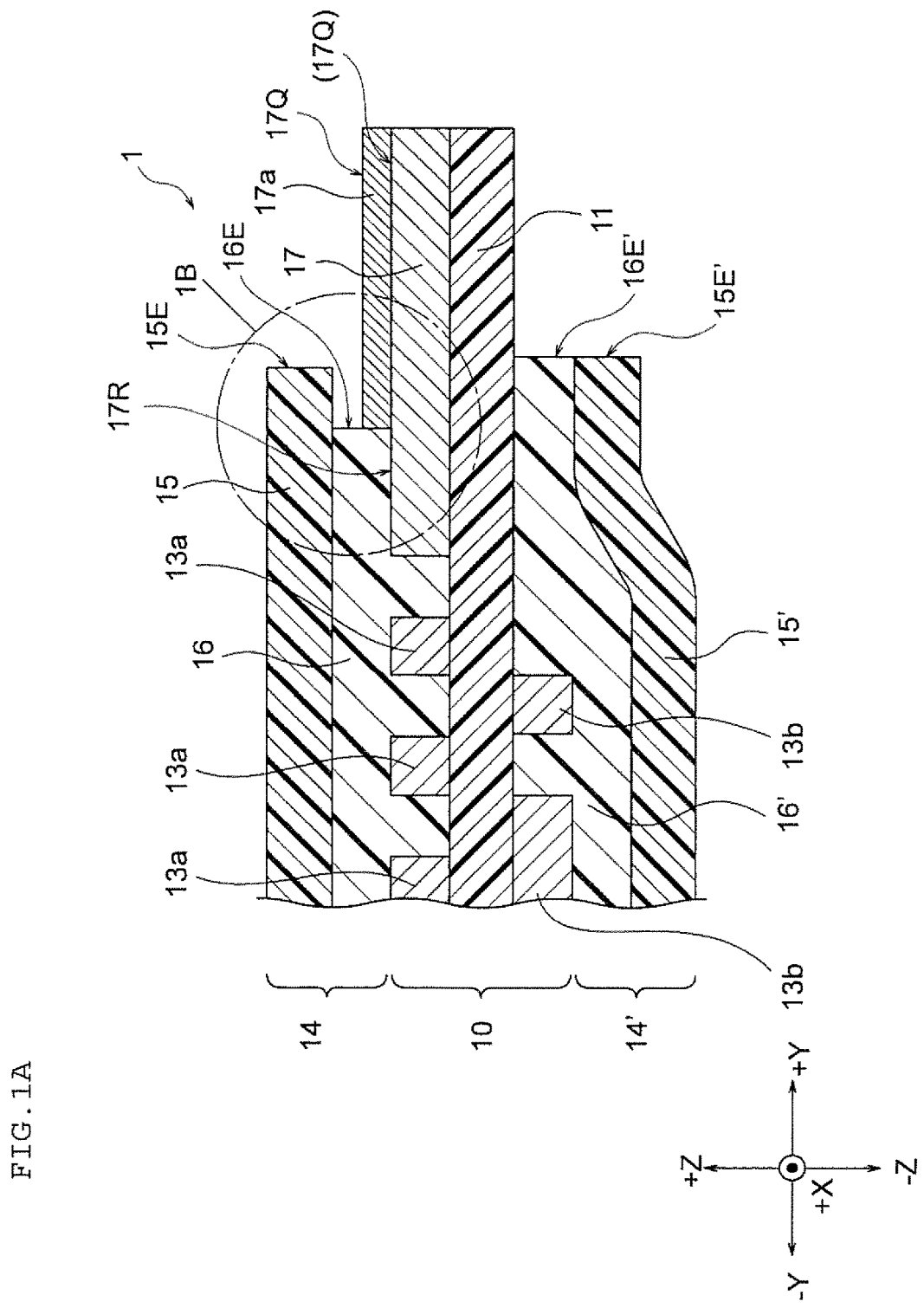
FIG. 1A is a cross-sectional view of a printed wiring board according to an embodiment of the present invention.
Figure 1B:
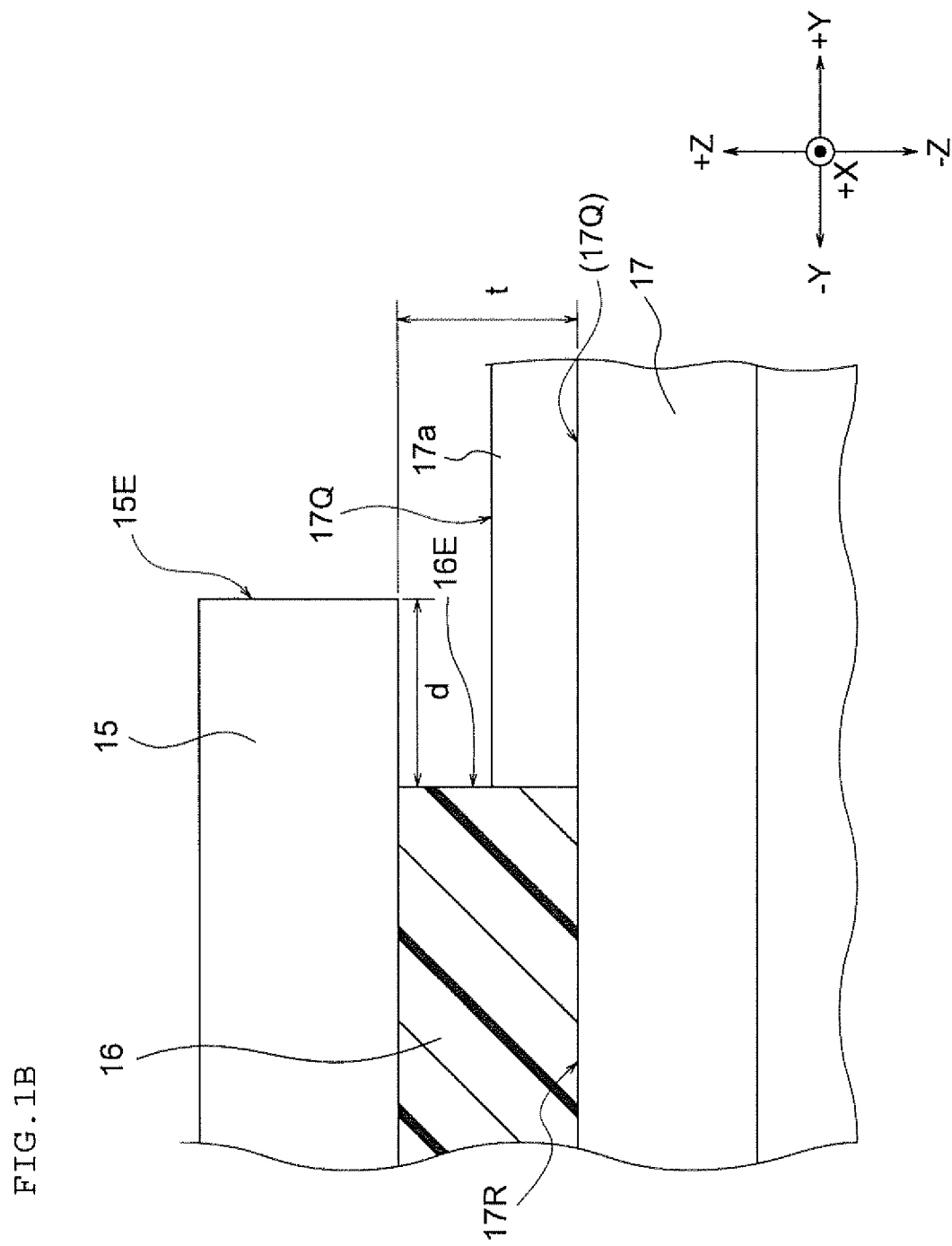
FIG. 1B is a view in which a region 1B illustrated in FIG. 1A is enlarged and illustrated.

FIG. 1A is a cross-sectional view of a printed wiring board 1 according to the present embodiment and FIG. 1B is a view in which a part 1B illustrated in FIG. 1A is enlarged and illustrated.

As illustrated in FIG. 1A, the printed wiring board 1 of the present embodiment comprises a substrate 10 and coverlays 14 laminated on one main surface (main surface at the +Z side in the figure) and the other main surface (main surface at the −Z side in the figure) of the substrate 10.

The substrate 10 comprises an insulating sheet 11 and at least one conductive layer 17 that is formed on one main surface or on each of both main surfaces of the insulating sheet 11. The substrate 10 of the present embodiment includes wirings 13a formed on one main surface (upper surface in the figure) of the insulating sheet 11 and wirings 13b formed on the other main surface (lower surface in the figure).

The insulating sheet 11 of the present embodiment has flexibility. The insulating sheet 11 is formed of an insulating resin. Examples of the insulating resin include polyimide, polyester, and polyethylene naphthalate. The thickness of the insulating sheet 11 may be 10 to 60 [μm], preferably 12.5 to 50 [μm], and further preferably 20 to 30 [μm]. The thickness of the insulating sheet 11 of the present embodiment is 25 [μm].

The conductive layer 17 and the wirings 13a and 13b are formed on main surfaces of the insulating sheet 11 of the present embodiment. The conductive layer 17 of the present embodiment includes an exposed surface 17Q that is exposed to have a function to be electrically connected to a conductive layer of another printed wiring board. The conductive layer 17 and the wirings 13a and 13b are formed of conductive materials, such as copper, silver, gold and carbon. The thickness of the conductive layer 17 and wirings 13a and 13b may be 5 to 40 [μm], preferably 10 to 33 [μm], and further preferably 15 to 20 [μm]. The thickness of the conductive layer 17 and wirings 13a and 13b of the present embodiment is 18 [μm].

The conductive layer 17 formed on one main surface of the insulating sheet 11 of the present embodiment has a first surface that is in contact with the insulating sheet 11 for the conductive layer 17 and a second surface that is a surface at the opposite side. The second surface of the conductive layer 17 includes the exposed surface 17Q which is exposed within a region outside than the position of an end part 16E of an adhesive layer 16 (this region is located at the right side of the end part 16E in FIG. 1A and FIG. 1B). The second surface of the conductive layer 17 further includes an adhesion surface 17R that is covered with the adhesive layer 16 within a region inside than the position of the end part 16E of the adhesive layer 16 (this region is located at the left side of the end part 16E in FIG. 1A and FIG. 1B).

The wirings 13a and 13b of the present embodiment are covered with the coverlays 14. The conductive layer 17 is to be electrically connected to a conductive layer of another printed wiring board as described above and therefore has a part (exposed surface 17Q) that is not covered with the coverlay 14. In the present embodiment, to improve the durability of the conductive layer 17, a treatment layer 17a is formed on the surface of the uncovered part of the conductive layer 17. The treatment layer 17a can be composed of a gold plating layer, silver plating layer, platinum plating layer, or other appropriate layer. The form of the treatment layer 17a is not limited and the uncovered part of the conductive layer 17 may first be covered with a metal, such as nickel and chromium, and may then be further covered with a noble metal, such as gold, silver and platinum. When the treatment layer 17a is formed on the surface of the uncovered part, which is not covered with the coverlay 14, of the conductive layer 17, one main surface of the treatment layer 17a (the surface which is not in contact with the conductive layer 17) is the exposed surface 17Q.

Each coverlay 14 has an insulating film 15 and an adhesive layer 16 laminated on a main surface of the insulating film 15. The coverlays 14 of which main surfaces are laminated on the substrate 10 so that the adhesive layers 16 cover the wirings 13a and 13b. In the present embodiment, two coverlay 14 and 14' of which main surfaces are laminated on one main surface and the other main surface of the substrate 10, respectively.

The insulating film 15 may be or may not be made of the same resin as that of the insulating sheet 11. The thickness of the insulating film 15 may be 5 to 30 [μm] and preferably 10 to 25 [μm]. The insulating film 15 of the present embodiment is a polyimide film having a thickness of 12.5 [μm].

The adhesive layer 16 can be obtained from a resin material, such as polyimide, polyester and polyethylene naphthalate. The material of the adhesive layer 16 may preferably be the same type of resin as that of the insulating film 15. The thickness of the adhesive layer 16 may be 10 to 50 [μm], preferably 15 to 40 [μm], and further preferably 20 to 35 [μm]. The thickness of the adhesive layer 16 of the present embodiment is 25 [μm]. The thickness of the adhesive layer 16 may scarcely vary in the manufacturing process. In the present embodiment, the difference between the thickness of the adhesive layer 16 at the time when the adhesive layer 16 is formed in the manufacturing steps and the thickness of the adhesive layer 16 in the manufactured printed wiring board 1 is less than 10% of the thickness of the adhesive layer 16 in the manufacturing steps.

Materials used to manufacture the printed wiring board 1 of the present embodiment are not particularly limited, and those known in the art at the time of filing of the present application can be appropriately used.

As illustrated in FIG. 1A and FIG. 1B, in the printed wiring board 1 of the present embodiment, the position of the end part 15E of the insulating film 15 which constitutes the coverlay 14 is located outside than the position of the end part 16E of the adhesive layer 16. The term "outside" associated with the printed wiring board 1 refers to a direction of separating from the central region of the printed wiring board 1 toward the outer edge side. FIG. 1A and FIG. 1B illustrate an example in which the +Y direction represents the outside. When the direction of separating from the central region of the printed wiring board 1 toward the outer edge side is the −Y direction, the −Y direction represents the outside. When the direction of separating from the central region of the printed wiring board 1 toward the outer edge side is the +/−X direction, the +/−X direction represents the outside. The outside in the printed wiring board 1 of the present embodiment refers to the direction toward the outer edge of the printed wiring board 1.

Here, the "end part 15E" of the insulating film 15 not only refers to the exposed end surface (surface indicated by the arrowed line with the reference numeral) of the insulating film 15 but includes the end surface as well as a part of the upper surface (surface at the +Z side) and a part of the lower surface (surface at the −Z side) which merge into the end surface. The same applies to the "end part 16E" of the adhesive layer 16. The relative positional relationship between the position of the "end part 15E" and the "end part 16E" in the present embodiment can be defined with reference to the positions along the Y direction in the figures. The relative positional relationship between the position of the "end part 15E" and the "end part 16E" can be defined on the basis of a predetermined reference. For example, the reference may be a position of the outer edge of the "end part 15E" (or of the outer edge of the "end part 16E") that protrudes most outward (+Y side) and may also be a position that is located most inside (−Y side). In an alternative embodiment, the reference may be a middle position between the positions which protrudes most outward (+Y side) and the position which is located most inside (−Y side).

The distance d, as illustrated in FIG. 1B, from the end part 16E of the adhesive layer 16 to the end part 15E of the insulating film 15 may preferably be 0.8 times or more and 20 times or less the thickness t of the adhesive layer 16. When the distance d from the end part 16E of the adhesive layer 16 to the end part 15E of the insulating film 15 and the thickness t of the adhesive layer 16 satisfy such a relationship, the occurrence of damage of the adhesive layer 16 can be efficiently suppressed.

In commonly-used manufacturing steps for printed wiring boards, in order that the insulating film of a coverlay does not delaminate at the end part of a printed wiring board, an adhesive material is made to protrude from the end surface of a sheet material. In such a conventional printed wiring board, the adhesive material protruding from the end surface of the coverlay is in a state of being exposed to external. Some external force is applied the printed wiring board during manufacturing, therefore, will damage the surface of the adhesive material so that the broken pieces and powder of the adhesive material may scatter around. As is known in the art, the adhesive material is relatively soft as compared with the insulating sheet. Thus, the adhesive material will be damaged and break even when the relatively hard insulating sheet merely comes into contact with the adhesive material. If such broken pieces and powder of the adhesive material adhere to the printed wiring board during manufacturing, they will cause troubles. In particular, if the scattering broken pieces and powder of the adhesive material adhere to the exposed surface of a conductive layer (part corresponding to the exposed surface 17Q of the present embodiment), they may cause serious troubles.

In the present embodiment, the printed wiring board 1 is configured such that the end part 15E of the insulating film 15 of the coverlay 14 is located at a position outside than the position of the end part 16E of the adhesive layer 16. According to the printed wiring board 1 of the present embodiment, the insulating film 15 covers the adhesive layer 16 to avoid exposure of the adhesive layer 16. Even if external impact, stress and the like are applied, the insulating film 15 can protect the adhesive layer 16 to prevent breakage of the adhesive layer 16 during the manufacturing steps. Since the adhesive layer 16 is not broken, the occurrence itself of broken pieces of the adhesive layer 16, which cause troubles of the printed wiring board 1, can be suppressed.

Next, a method of manufacturing the printed wiring board 1 of the present embodiment will be described with reference to FIG. 2.

Figure 2A:
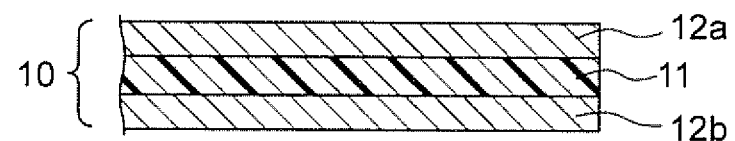
FIG. 2(A) to FIG. 2(C) are views for describing a method of manufacturing the printed wiring board illustrated in FIG. 1.

First, as illustrated in FIG. 2(A), a double-sided copper clad substrate 10 to be the substrate 10 is prepared. The double-sided copper clad substrate 10 has an insulating sheet 11 composed of a resin, such as polyethylene terephthalate (PET), polyethylene naphthalate (PEN) and polyimide (PI), and metal layers 12a and 12b, such as Cu, Au and Ag layers, formed on both main surfaces of the insulating sheet 11. The metal layers 12a and 12b may each be configured by applying metal foil. They may also be formed by copper plating after vapor deposition or sputtering of copper or other metal.

Figure 2B:
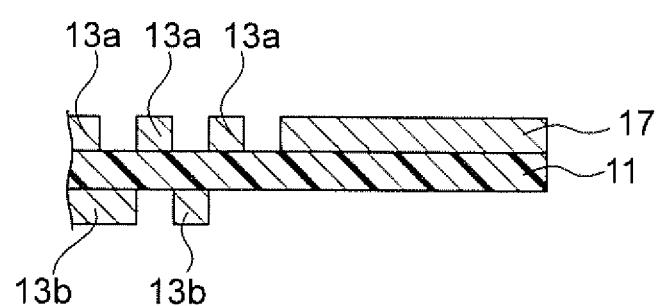

As illustrated in FIG. 2(B), predetermined regions of the metal layers 12a and 12b are etched using a common photolithographic technique to form desired wirings 13a and 13b and conductive layer 17.

Figure 2C:
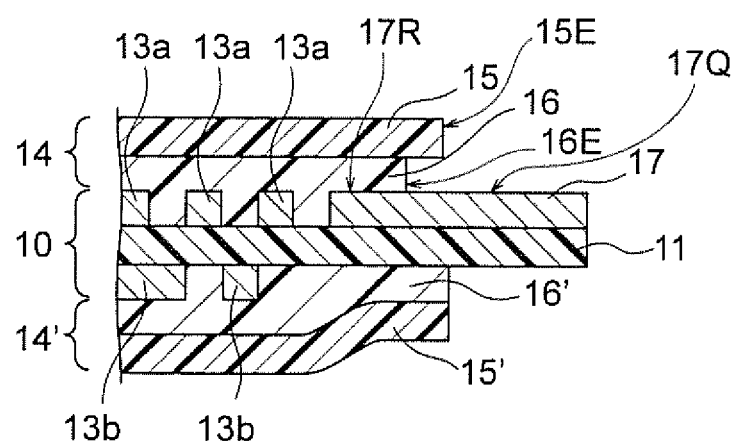

As illustrated in FIG. 2(C), a coverlay 14 of which a main surface is laminated at one main surface side of the substrate 10. The conductive layer 17 is formed at the one main surface side. The coverlay 14 of this example comprises an insulating film 15 that is composed of a resin such as polyimide having insulating property as described above and an adhesive layer 16 that is composed of thermoplastic polyimide or the like having heat-resisting property. The coverlay 14 of which a main surface is laminated on the substrate 10 so that the adhesive layer 16 covers the wirings 13a. In order that the end part 16E of the adhesive layer 16 is located at the side of the wirings 13a than the end part 15E of the insulating film 15, the adhesive layer 16 covering the wirings 13a is worked so that its edge part is removed to reduce the surface area by an amount corresponding to the removed edge part. The edge part of the adhesive layer 16 may be preliminarily removed or may also be removed after the lamination.

The end part 16E of the adhesive layer 16 of the coverlay 14 is located at a position inside than the position of the end part 15E of the insulating film 15. The end part 15E of the insulating film 15 has a structure in which the end part 15E protrudes outside than the end part 16E of the adhesive layer 16. The conductive layer 17 and the insulating sheet 11 on which the conductive layer 17 is formed also have structures in which they protrude outside than the end part 16E of the adhesive layer 16. The end part 16E of the adhesive layer 16 is interposed between the protruding insulating film 15 and the protruding insulating sheet 11 from up-and-down sides and protected by them. The second surface (upper surface in the figure) of the conductive layer 17 includes an exposed surface 17Q that is exposed within a region located outside than the position of the end part 16E of the adhesive layer 16 (located at the right side of the end part 16E in FIG. 2(C)). The second surface of the conductive layer 17 further includes an adhesion surface 17R that is in contact with the adhesive layer 16 within a region located inside than the position of the end part 16E of the adhesive layer 16 (located at the left side of the end part 16E in FIG. 2(C)). This adhesion surface 17R is covered by the adhesive layer 16.

As illustrated in FIG. 2(C), another coverlay 14' of which the main surface is laminated at the other main surface side of the substrate 10. The coverlay 14' is made of the same material as that of the previously-described coverlay 14. The coverlay 14' is laminated on the substrate 10 so that its adhesive layer 16 covers wirings 13b that are formed on the other main surface of the insulating sheet 11. At the other main surface side, the end part 16E' of the adhesive layer 16' of the coverlay 14' is located at the same position as that of the end part 15E' of the insulating film 15'. Thus, with regard to the coverlay 14' laminated at a main surface that is not formed with a conductive layer 17, the end part 16E' of the adhesive layer 16' may not have to be shifted inside. As will be understood, at the other main surface side, a conductive layer 17' (not illustrated) may be provided at the other main surface side of the insulating sheet 11 as with the one main surface side so that the end part of the adhesive layer 16' of the coverlay 14' is located at a position inside than the position of the end part or the insulating film 15'.

The possibility of breakage of the insulating film 15 due to external force is lower than the possibility of breakage of the adhesive layer 16 due to external force because the insulating film 15 is harder than the adhesive layer 16 (i.e. has higher rigidity than that of the adhesive layer 16). In the present embodiment, the insulating film 15 protects the adhesive layer 16 to reduce the possibility that the broken pieces of the adhesive layer 16 occur, thereby to prevent such broken pieces of the adhesive layer 16 from adhering to the printed wiring board 1. The coverlay 14, of which a main surface is laminated at the main surface side formed with the conductive layer 17 (including the exposed surface 17Q) to be electrically connected to external, is configured such that the position of the end part 16E of the adhesive layer 16 is located inside than the position of the end part 15E of the insulating film 15. This is because the broken pieces of the adhesive layer 16 formed on the same main surface together with the conductive layer 17 tend to readily adhere to the exposed surface 17Q of the conductive layer 17.

In the example illustrated in FIG. 1A and FIG. 1B, the end part 16E' of the adhesive layer 16' of the coverlay 14' laminated on the other main surface (lower side (in the −Z direction) in the figures) of the insulating sheet 11 is located at the same position in the +Y direction as that of the end part 15E' of the insulating film 15', but may also be configured to protrude outside than the end part 16E' of the adhesive layer 16'.

In particular, if the adhesive layer 16 of the coverlay 14 laminated on the insulating sheet 11 formed with the conductive layer 17 is broken, the broken pieces may be highly possible to adhere to the exposed surface 17Q of the conductive layer 17. This possibility is high when the conductive layer 17 and the adhesive layer 16 are formed on the same main surface of the insulating sheet 11 as in the present embodiment, that is, when the conductive layer 17 and the adhesive layer 16 are in contact with each other. Further particular, when the exposed surface 17Q of the conductive layer 17 and the adhesive layer 16 are in contact with each other (adjacent to each other) as in the present embodiment, the possibility further increases that the broken pieces generated when the adhesive layer 16 breaks adhere to the exposed surface 17Q. If the broken pieces of the adhesive layer 16 adhere to the conductive layer 17 or to the exposed surface 17Q of the conductive layer 17, the possibility that troubles occur in the performance of the printed wiring board 1 will increase.

In the present embodiment, the insulating film 15 protects the end part 16E of the adhesive layer 16 of the coverlay 14 and troubles can therefore be prevented that the adhesive layer 16 breaks and the broken pieces of the adhesive layer 16 adhere to the conductive layer 17. In particular, the insulating film 15 can protect the end part 16E of the adhesive layer 16 of the coverlay 14, which is laminated on the main surface of the insulating sheet 11 formed with the conductive layer 17, thereby to prevent the breakage of the adhesive layer 16, and a trouble that broken pieces of the adhesive layer 16 adhere to the conductive layer 17 can thus be prevented. As will be understood, it may suffice that the end part 16E of the adhesive layer 16 and the insulating film 15 are in contact with each other at one part, such as an upper end part of the end part 16E. The form of contact (position of contact, extent of contact) between the adhesive layer 16 and the insulating film 15 may be different depending on the shape of the adhesive layer 16.

The coverlay 14 is worked, before being attached to the substrate 10, so that the end part of the adhesive layer 16 is located inside than the end part of the insulating film 15. The method of working to be used for the adhesive layer 16 may be, but is not limited to being, a method of cutting the adhesive layer 16 using a metal die or blade, a method of cutting the adhesive layer 16 by laser, or a method of removing the end part by etching. The adhesive layer 16 may be attached to the insulating film 15 after the end part of the adhesive layer 16 is removed, or the end part of the adhesive layer 16 may be removed after the adhesive layer 16 is attached to the insulating film 15. In the present embodiment, the edge part of the adhesive layer 16 attached to the insulating film 15 is removed using YAG laser and the coverlay 14 is worked so that the position of the end part of the adhesive layer 16 is located inside than the end part of the insulating film 15. As previously described, the variation in the thickness t of the adhesive layer 16 of the coverlay 14 is very small during the manufacturing steps for the printed wiring board 1.

Finally, a treatment layer 17a is formed on the surface of the conductive layer 17 to be electrically connected to a conductive layer of another printed wiring board and the printed wiring board 1 as illustrated in FIG. 1A is thus obtained.

Second Embodiment

A second embodiment will be described below with reference to FIG. 3 and FIG. 4.

Figure 3A:
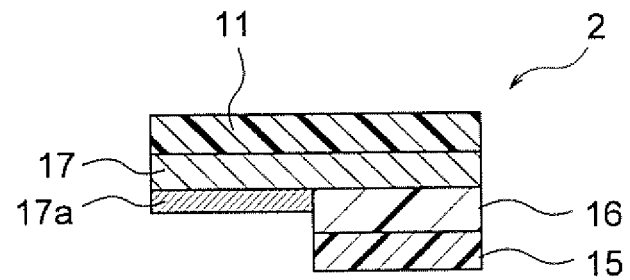
FIG. 3(A) and FIG. 3(B) are views for describing an example of using the printed wiring board according to an embodiment.
Figure 3A:
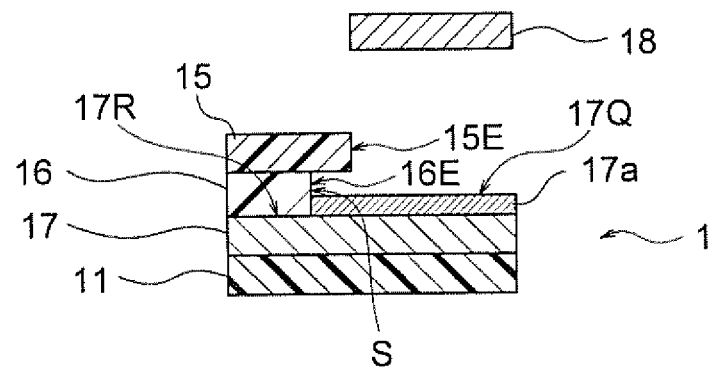

As illustrated in FIG. 3(A), the printed wiring board 1 of the present embodiment is to be electrically connected to another printed wiring board 2. Specifically, the conductive layer 17 of the printed wiring board 1 of the present embodiment is to be electrically connected to another conductive layer 17 of another printed wiring board 2. The printed wiring board 2 comprises an insulating sheet 11, conductive layer 17, adhesive layer 16, and insulating film 15. A treatment layer 17a is formed as necessary on the surface of a part, which is not covered with the adhesive layer 16, of the conductive layer 17 of the printed wiring board 1 according to the present embodiment. In this case, the exposed surface (upper surface in the figure) of the treatment layer 17a is an exposed surface 17Q. Each configuration is in common with each configuration of the printed wiring board 1 as described in the first embodiment, so the description will be made using the same reference numeral.

In this example, as illustrated in FIG. 3(A), the second surface (surface at the opposite side to the surface in contact with the insulating sheet 11) of the conductive layer 17 includes the exposed surface 17Q which is exposed within a region outside than the position of the end part 16E of the adhesive layer 16 (right-side region of the printed wiring board 1 in the figure). The second surface of the conductive layer 17 further includes the adhesion surface 17R which is covered with the adhesive layer 16 within a region inside than the position of the end part 16E of the adhesive layer 16 (left-side region of the printed wiring board 1 in the figure).

As illustrated in FIG. 3(A), arrangement is made such that the conductive layer 17 of the printed wiring board 1 and another conductive layer 17 of another printed wiring board 2 face each other. A conductive adhesion layer 18 is interposed between the conductive layers 17 facing each other and pressed from above and from below, and cure treatment is performed if necessary.

The conductive adhesion layer 18 of the present embodiment is formed of an anisotropic conductive film (ACF). The ACF has insulating property in the surface direction and conductive property in the thickness direction. The ACF may be used, such as when each conductive layer 17 comprises a plurality of conductive layers and each pair of conductive layers 17 disposed to face each other is to be electrically conducted as in the case of FIG. 3(A) or when an electronic component is mounted. The anisotropic conductive layer 18 of the present embodiment may be, but is not limited to being, obtained by forming a thin material in which conductive particles are dispersed in a resin material. Examples of the conductive particles (or conductive filler) to be used include metal particles, semiconductor particles such as indium-doped tin oxide, and carbon particles. Examples of the resin material to be used include silicone rubber-based material, polyurethane-based resin material, epoxy-based resin material, phenol-based resin material, and polyester-based resin material. An anisotropic conductive paste (ACP) may also be used as substitute for the ACE If, in this process, foreign materials adhere to the exposed surface 17Q of the conductive layer 17, the conductive filler will not electrically conduct one substrate to the other and the connection failure may possibly occur. In addition, if pieces of the conductive adhesion layer 18 containing the conductive filler scatter around and the conductive filler adheres to the other wirings, cross talk may be caused. In the conventional method, when two printed wiring boards 1 and 2 are laminated, the conductive adhesion layer 18 may leak out to adhere to the surface of the printed wiring board 1, 2, and the leaked-out adhesive may possibly be carried into the manufacturing steps as foreign materials.

As illustrated in FIG. 3(A), the end part 16E of the adhesive layer 16 in the present embodiment is shifted (drawn back) inside from the end part 15E of the insulating film 15. The end part 16E of the adhesive layer 16, the main surface of the insulating film 15, and the treatment layer 17a of the conductive layer 17 form a space S that is surrounded by them from three directions.

Figure 3B:
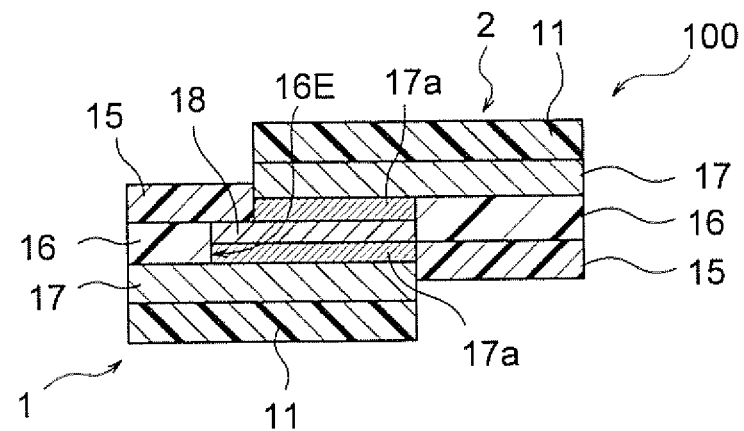

FIG. 3(B) is a view illustrating a cross-sectional structure of a printed wiring board 100 in which separate printed wiring board 1 and printed wiring board 2 are attached to each other. When the conductive adhesion layer 18 is interposed between the conductive layers 17 facing each other and pressed from above and from below, the conductive adhesion layer 18 flows into the space S which is generated by drawing back the end part 16E of the adhesive layer 16 inside than the end part 15E of the insulating film 15. Moreover, even if the volume of the conductive adhesion layer 18 is large, the main surface (lower surface in the figure) merging into the end part 15E of the protruding insulating film 15 serves as an in-gate (embankment/weir) to prevent lifting of the conductive adhesion layer 18 to the surface of the substrate. This can prevent the conductive adhesion layer 18 from adhering to the surface of the printed wiring board 1, 2 during the manufacturing. This can therefore prevent the conductive adhesion layer 18 from being carried into the manufacturing as foreign materials and can also prevent the contamination of the printed wiring board 1.

For comparison with the printed wiring board 100 of the present embodiment, a printed wiring board 100' as a comparative example is illustrated in FIGS. 4(A) and 4(B). The printed wiring board 100' is configured such that a printed wiring board 3' and a printed wiring board 2' are electrically connected with a conductive adhesion layer 18'. The end part 16E' of an adhesive layer 16' of the printed wiring board 3' is located at a position outside than the position of the end part 15E' of an insulating film 15'. That is, the adhesive layer 16' is exposed, which is different from that in the printed wiring board 100 of the present embodiment illustrated in FIG. 3(B).

In the comparative example, when the printed wiring board 3' and the printed wiring board 2' are attached to each other, the exposed end part 16E' of the adhesive layer 16' is likely to receive external force. In other words, the end part 16E of the adhesive layer 16 may possibly be cracked (broken) and the broken pieces may scatter around. In addition, breakage may readily occur to cause the broken pieces to scatter around away because the conductive adhesion layer 18' is also made of a soft material. Moreover, the printed wiring board 3' illustrated in FIGS. 4(A) and 4(B) does not have a space S as formed between the end part 16E of the adhesive layer 16 and the main surface of the insulating film 15 in the embodiment illustrated in FIGS. 3(A) and 3(B) and therefore the conductive adhesion layer 18' pressed from above and from below may leak out to external along the interface between the printed wiring board 3' and the printed wiring board 2'. The conductive adhesion layer 18' leaked out to external adheres to the surface of the printed wiring board 100'. This causes troubles of the printed wiring board 100' because the conductive adhesion layer 18' contains conductive particles.

In contrast, the printed wiring board 100 of the present embodiment is configured such that the end part 16E of the adhesive layer 16 is located inside than the end part 15E of the insulating film 15. Owing to this arrangement, the space S exists outside than the end part 16E of the adhesive layer 16. This space S can enclose a part of the conductive adhesion layer 18 to suppress leakage of the conductive adhesion layer 18 to external. This can result in prevention of troubles which may be caused in the structure of the printed wiring board 100' as illustrated in FIGS. 4(A) and 4(B).

In the printed wiring board 100 of the present embodiment, the conductive adhesion layer 18 for connecting/attaching the separate boards to each other does not override the insulating film 15 and therefore the contamination and cross talk of the printed wiring board 100 can be prevented. According to the present embodiment, the printed wiring board 100 can be provided which has high reliability.

Tests were conducted to confirm the effects according to the printed wiring board 1 of the present embodiment. This will be described below.

EXAMPLES

For each of Examples 1 to 5 and Comparative Example 1 and 2, a printed wiring board 100 having the structure as illustrated in FIG. 3B was produced using a printed wiring board 1 and printed wiring board 2 as illustrated in FIG. 3A. The printed wiring board 100 has a structure in which a conductive layer 17 of the printed wiring board 1 and a conductive layer 17 of the printed wiring board 2 are electrically connected to each other with a conductive adhesion layer 18.

First, the printed wiring board 1 and the printed wiring board 2 as illustrated in FIG. 3A were produced. To produce each of the printed wiring board 1 and the printed wiring board 2, as in the first embodiment, a double-sided copper clad substrate 10 was used as the material of the substrate 10. The double-sided copper clad substrate 10 has a structure in which copper foil is attached to each of both surfaces of a polyimide sheet having a thickness of 25 [μm]. Wirings 13a and 13b and a conductive layer 17 having a thickness or 18 [μm] were formed using a photolithographic technique. A coverlay 14 was used with its adhesive layer 16 of a thickness of 25 [μm] formed on a polyimide sheet (insulating film 15) of a thickness of 12.5 [μm]. In the printed wiring board 1 for each of Examples 1 to 5, the coverlay 14 was preliminarily worked by irradiation of YAG laser such that, as illustrated in FIG. 3A, the position of the end part 16E of the adhesive layer 16 was located inside than the position of the end part 15E of the insulating film 15. An anisotropic conductive film of a thickness of 50 [μm] was used as the conductive adhesion layer 18 to be interposed between the conductive layer 17 of the printed wiring board 1 and the conductive layer 17 of the printed wiring board 2.

In each of Examples 1 to 5 and Comparative Examples 1 and 2, the distance d from the end part 16E of the adhesive layer 16 to the end part 15E of the insulating film 15 (see FIG. 1B) was set such that a ratio obtained by dividing the distance d by the thickness t of the adhesive layer 16 (see FIG. 1B) would be a numerical value [distance d/thickness t] as listed in Table 1 below. The thickness t of the adhesive layer 16 was a fixed value of 25 [μm]. The thickness t of the adhesive layer 16 described herein is in common with the thickness of the adhesive layer 16 in the printed wiring board 100 according to the examples as illustrated in FIG. 3B. The variation in the thickness of the adhesive layer 16 of the coverlay 14 was very small during the manufacturing steps.

Evaluation was performed in terms of the following evaluation items.

Evaluation 1: It was evaluated whether or not the conductive adhesion layer 18 leaked out when the printed wiring boards 1 and 2 (printed wiring boards 3' and 2') were attached to each other with the conductive adhesion layer 18. If the conductive adhesion layer 18 leaks out and adheres to the surface of the printed wiring board 100, this may cause troubles. In other words, if the conductive adhesion layer 18 does not leak out, it can be determined that the risk of incorporation of conductive particles is low. When it was visually confirmed that the leaked conductive adhesion layer 18 did not adhere to the surface of the printed wiring board 100 of each example or the printed wiring board 100' of each comparative example, the evaluation was made with indication of "Good: o" while when it was visually confirmed that the leaked conductive adhesion layer 18 did adhere to the surface of the printed wiring board 100 of each example or the printed wiring board 100' of each comparative example, the evaluation was made with indication of "Not Good: x."

Evaluation 2: It was evaluated whether or not the gold plating layer was able to be formed on the surface of the conductive layer 17. If the end part 15E of the insulating film 15 excessively protrudes outside than the end part 16E of the adhesive layer 16, bubbles generated during the gold plating may disadvantageously remain between the insulating film 15 and the conductive layer 17, so that the plating liquid may not come around the surface of the conductive layer 17 in the vicinity of the end part 16E. In such a case, the gold plating layer may not be formed on the surface of the conductive layer 17 in part. In other words, if the gold plating layer can be formed on the surface of the conductive layer 17, it can be evaluated that disadvantages in manufacturing do not take place when the insulating film 15 is made to protrude outside than the adhesive layer 16. When it was visually confirmed that the gold plating layer was able to be formed on the surface of the conductive layer 17, the evaluation was made with indication of "Good: o (O)." When it was visually confirmed that the gold plating layer was not able to be formed on the surface of the conductive layer 17, the evaluation was made with indication of "Not Good: x (X)."

Evaluation 3: It was visually evaluated whether foreign materials originated from the adhesive layer 16 did not adhere to the surface (exposed surface 17Q) of the conductive layer 17 when the printed wiring boards 1 and 2 (printed wiring boards 3' and 2') were attached to each other. In the present description, the surface of the conductive layer 17 refers to a concept that encompasses the surface of the treatment layer 17a. When the treatment layer 17a is formed on the surface of the conductive layer 17, therefore, the "surface of the conductive layer 17" refers to the "surface of the treatment layer 17a." In other words, when the treatment layer 17a is formed on the surface of the conductive layer 17, the exposed surface 17Q is formed at the surface of the treatment layer 17a. Since the surface of the treatment layer 17a is formed in each of Examples 1 to 5 and Comparative Example 1 and 2, it was confirmed in Evaluation 3 whether or not foreign materials did adhere to the exposed surface 17Q of the treatment layer 17a.

It was visually evaluated whether or not foreign materials originated from the adhesive layer 16 did adhere to the surface (exposed surface 17Q) of the treatment layer 17a in each of the printed wiring boards 1 and 2 illustrated in FIG. 3(A) and the printed wiring boards 2' and 3' illustrated in FIG. 4(A). If the adhesive layer 16 is damaged during the manufacturing step and the broken pieces thereof adhere to the surface of the treatment layer 17a, this may cause troubles. If the adhesive layer 16 is not damaged, the risk that foreign materials adhere can be evaluated to be low.

First, 100 samples were prepared of each of the printed wiring boards 100 of the examples and the printed wiring boards 100' of the comparative examples. It was visually confirmed whether or not foreign materials originated from the adhesive layer 16 did adhere to the surface (corresponding to the exposed surface 17Q of the examples) of the treatment layer 17a of the printed wiring board 100. As for each of the examples, when the number of the printed wiring boards 100, among the 100 samples, in which foreign materials originated from the adhesive layer 16 were visually confirmed to adhere to the exposed surface 17Q of the treatment layer 17a was ten or less, the evaluation was made with indication of "Good: o" while when that number was more than ten, the evaluation was made with indication of "Not Good: x." The same evaluation was performed for the printed wiring boards 100' of the comparative examples on the basis of the same criterion.

Table 1 lists the results of Evaluation 1, Evaluation 2 and Evaluation 3.

TABLE 1

| No. | Distance (d) [μM] | Distance d/ Thickness t | Evaluation 1 Whether leakage of conductive adhesive layer was confirmed? | Evaluation 2 Whether gold plating layer was able to be formed? | Evaluation 3 Whether foreign materials did adhere to conductive layer? |
|---|---|---|---|---|---|
| Comparative Example 1 | 0 | — | × | ○ | × |
| Comparative Example 2 | 10 | 0.4 | × | ○ | ○ |
| Example 1 | 20 | 0.8 | ○ | ○ | ○ |
| Example 2 | 50 | 2 | ○ | ○ | ○ |
| Example 3 | 100 | 4 | ○ | ○ | ○ |
| Example 4 | 200 | 8 | ○ | ○ | ○ |
| Example 5 | 500 | 20 | ○ | ○ | ○ |
| Comparative Example 3 | 1000 | 100 | ○ | × | ○ |

Leakage of the conductive adhesion layer 18 was found in Evaluation 1 when, as in Comparative Example 1 listed in Table 1, the distanced (see FIG. 1B) from the end part 16E of the adhesive layer 16 to the end part 15E of the insulating film 15 was zero, that is, when the end part 16E of the adhesive layer 16 and the end part 15E of the insulating film 15 were located at the same position. In Evaluation 3, the number of the printed wiring boards 100' of Comparative Example 1, among the total of 100 samples, in which foreign materials originated from the adhesive layer 16' were determined to adhere to the conductive layer 17' or to the surface of the treatment layer 17a' did exceed ten. It has thus been found that the printed wiring board 100' according to Comparative Example 1 has a structure that is likely to cause foreign materials originated from the adhesive layer 16.

Leakage of the conductive adhesion layer 18 was also found in Evaluation 1, that is, a phenomenon that the conductive adhesion layer 18 did lift above another substrate was found when, as in Comparative Example 2, the ratio obtained by dividing the distance d (see FIG. 1B) from the end part 16E of the adhesive layer 16 to the end part 15E of the insulating film 15 by the thickness t (see FIG. 1B) of the adhesive layer 16 was 0.4 or less. The protruding amount of the end part 15E of the insulating film 15 according to Comparative Example 2 was therefore evaluated to be insufficient.

When, as in Comparative Example 3, the ratio obtained by dividing the distance d (see FIG. 1B) to the end part 15E of the insulating film 15 by the thickness t of the adhesive layer 16 was 100 or more, the gold plating layer was not able to be formed in Evaluation 2, and the protruding amount of the end part 15E of the insulating film 15 was therefore evaluated to be unduly large. It has thus been found that an unduly large protruding amount of the end part 15E of the insulating film 15 inhibits the formation of the gold plating layer even though the leakage of the conductive adhesion layer 18 can be suppressed.

Examples 1 to 5 exhibited good results in Evaluation 1, Evaluation 2, and Evaluation 3. That is, when the ratio obtained by dividing the distanced (see FIG. 1B) to the end part 15E of the insulating film 15 by the thickness t of the adhesive layer 16 was 0.8 or more and 20 or less, leakage of the conductive adhesion layer 18 was not found during the lamination and the gold plating layer was able to be formed. Moreover, the number of the printed wiring boards 100 according to each of Examples 1 to 5, among the 100 samples, in which foreign materials originated from the adhesive layer 16 did adhere to the surface of the treatment layer 17a was less than 10.

It has also been found that, when the length of the distance d exceeds 20 times the thickness t of the adhesive layer 16, the formation of the conductive adhesion layer 18 tends to be inhibited.

The second insulating substrate of the present invention refers to a concept that encompasses the insulating sheet 11 of the substrate 10 and the insulating film 15 of the coverlay 14. In the present embodiment, the insulating sheet 11 of the substrate 10 corresponds to the first insulating substrate while the insulating film 15 of the coverlay 14 corresponds to the second insulating substrate. In another embodiment that falls within the scope of the present invention, the insulating sheet 11 of the substrate 10 may correspond to the second insulating substrate.

Third Embodiment

A third embodiment will be described below with reference to FIG. 5.

The third embodiment relates to a printed wiring board 200 of a multilayer structure to which the present invention is applied.

The first and second embodiments have been described as examples in which the insulating film 15 of the coverlay 14 corresponds to the second insulating substrate of the present invention, but the third embodiment will be described as an example in which the insulating sheet 11 of the substrate 10 corresponds to the second insulating substrate of the present invention.

FIG. 5(A) to FIG. 5(F) are views for describing steps of a method of manufacturing the printed wiring board 200 of a multilayer structure according to the third embodiment. The printed wiring board 200 of the present embodiment will be described in line with these manufacturing steps.

Figure 5A:
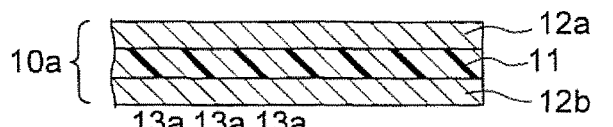
FIG. 5(A) to FIG. 5(F) are views for describing a method of manufacturing a printed wiring board of a multilayer structure according to an embodiment of the present invention.
Figure 5B:
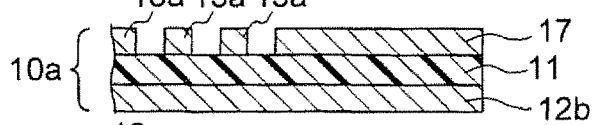

First, as illustrated in FIG. 5(A), a double-sided copper clad substrate 10a is prepared. The double-sided copper clad substrate 10a comprises an insulating sheet 11 and metal layers 12a and 12b formed on both surfaces of the insulating sheet 11. The double-sided copper clad substrate 10a is the same as the double-sided copper clad substrate 10 used in the first embodiment. As illustrated in FIG. 5(B), predetermined regions of the metal layer 12a at one main surface side are removed using a photolithographic technique to form desired wirings 13a and a conductive layer 17.

Then, a single-sided copper clad substrate 10b is prepared. The single-sided copper clad substrate 10b comprises an insulating sheet 11 and a metal layer 12a formed only on one main surface of the insulating sheet 11. The material of the insulating sheet 11 and the material of the metal layer 12a of the single-sided copper clad substrate 10b are the same as those of the double-sided copper clad substrate 10a.

Figure 5C:
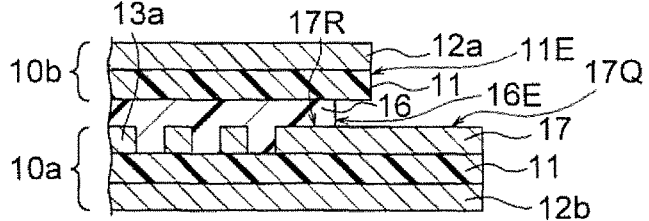

Then, as illustrated in FIG. 5(C), the single-sided copper clad substrate 10b is laminated at the one main surface side of the double-sided copper clad substrate 10a with an adhesive layer 16. The adhesive layer 16 may be formed by printing or may also be attached at the other main surface side of the single-sided copper clad substrate 10b.

Figure 5D:
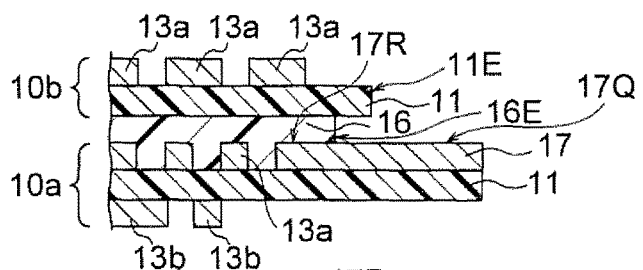

As illustrated in the figure, the end part 16E of the adhesive layer 16 of the present embodiment is located at a position inside than the position of an end part 11E of the insulating sheet 11 of the single-sided copper clad substrate 10b. In other words, the end part 11E of the insulating sheet 11 of the single-sided copper clad substrate 10b is located at a position outside than the position of the end part 16E of the adhesive layer 16 of this example. As illustrated in FIG. 5(C), a second surface (surface at the opposite side to the surface in contact with the insulating sheet 11) of the conductive layer 17 includes an exposed surface 17Q that is exposed within a region outside than the position of the end part 16E of the adhesive layer 16 (right-side region in the figure). The second surface of the conductive layer 17 further includes an adhesion surface 17R that is covered by the adhesive layer 16 within a region inside the position of the end part 16E of the adhesive layer 16 (left-side region in the figure). As illustrated in FIG. 5(D), predetermined regions of the metal layer 12a of the single-sided copper clad substrate 10b are etched to form wirings 13a.

Figure 5E:
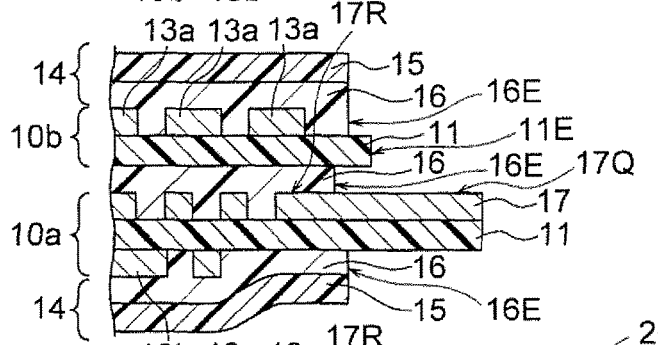

Further, as illustrated in FIG. 5(E), a coverlay 14 is laminated at the one main surface side of the single-sided copper clad substrate 10b with an adhesive layer 16. Similarly, another coverlay 14 is laminated at the other main surface side of the double-sided copper clad substrate 10a with an adhesive layer 16.

Figure 5F:
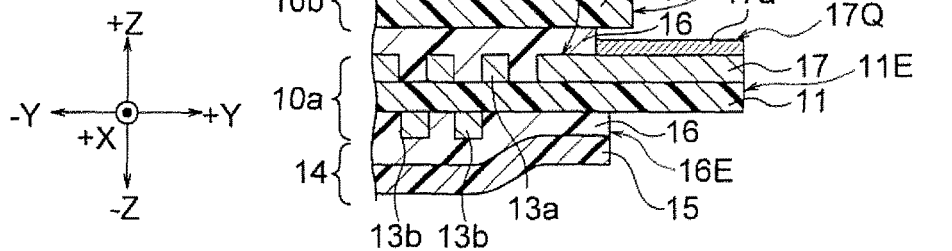

Finally, as illustrated in FIG. 5(F), a treatment layer 17a is formed on the surface of the conductive layer 17 and the printed wiring board 200 of a multilayer structure is thus obtained.

Thus, also in the printed wiring board 200 of a multilayer structure, the structure described in the first and second embodiments can be realized, that is, a characteristic structure can be realized in which the position of the end part 11E of the insulating sheet 11 is located outside than the position of the end part 16E of the adhesive layer 16. The action and effect as described in the first and second embodiments can be obtained also in the printed wiring board 200 of a multilayer structure according to the third embodiment.

In particular, the printed wiring board 200 of a multilayer structure requires a number of manufacturing steps and it is thus highly possible that the printed wiring board during the manufacturing receives external force. According to the present embodiment, the position of the end part 11E of the insulating sheet 11 is located outside the position of the end part 16E of the adhesive layer 16 and the adhesive layer 16 can thereby be prevented from being broken.

The action and effect as described in the first and second embodiments can be obtained also in the printed wiring board 200 which is configured such that the conductive layer 17 has the exposed surface 17Q.

Embodiments heretofore explained are described to facilitate understanding of the present invention and are not described to limit the present invention. It is therefore intended that the elements disclosed in the above embodiments include all design changes and equivalents to fall within the technical scope of the present invention.

DESCRIPTION OF REFERENCE NUMERALS 1, 2, 100, 200 Printed wiring board
10 Substrate
(10, 10a Double-sided copper clad substrate)
(10b Single-sided copper clad substrate)
11 Insulating sheet
   11E End part of insulating sheet
12 Metal layer
   12a Metal layer (at one main surface side)
   12b Metal layer (at the other main surface side)
13 Wirings
   13a Wirings (at one main surface side)
   13b Wirings (at the other main surface side) Coverlay
15 Insulating film
15E End part of insulating film
16 Adhesive layer
16E End part of adhesive layer
17 Conductive layer
17a Treatment layer, Gold plating layer
18 Conductive adhesion layer

The invention claimed is:

1. A printed wiring board comprising:
a first insulating substrate;
a first conductive layer on one main surface of the first insulating substrate;
a second insulating substrate of which a main surface is laminated at a side of the main surface of the first insulating substrate; and
an adhesive layer between the first insulating substrate and the second insulating substrate,
wherein a position of an end surface of an end part of the second insulating substrate is located outside a position of an end surface of an end part of the adhesive layer,
wherein the first conductive layer has a second surface that is a surface at an opposite side to a first surface of the first conductive layer in contact with the first insulating substrate,
wherein the second surface of the first conductive layer includes an exposed surface of the first conductive layer that is exposed within a region located outside the position of the end surface of the adhesive layer,
wherein the exposed surface of the first conductive layer, the end surface of the adhesive layer, and the main surface of the second insulating substrate are arranged to surround an external space from three directions, and
wherein a distance from the end part of the adhesive layer to the end part of the second insulating substrate is 0.8 times or more and 20 times or less a thickness of the adhesive layer.

2. The printed wiring board according to claim 1, further comprising
a second conductive layer provided at another printed wiring board,
wherein the exposed surface of the first conductive layer is electrically connected to the second conductive layer.

3. The printed wiring board according to claim 2, wherein an anisotropic conductive layer is disposed in an interspace between the first conductive layer and the second conductive layer, wherein the interspace includes the external space.

4. The printed wiring board according to claim 3, wherein an anisotropic conductive layer is disposed between the first conductive layer and the second conductive layer.

5. A printed wiring board comprising:
a first insulating substrate;
a first conductive layer on one main surface of the first insulating substrate;
a second insulating substrate of which a main surface is laminated at a side of the main surface of the first insulating substrate; and
an adhesive layer between the first insulating substrate and the second insulating substrate,
wherein a position of an end surface of an end part of the second insulating substrate is located outside a position of an end surface of an end part of the adhesive layer,
wherein the first conductive layer has a second surface that is a surface at an opposite side to a first surface of the first conductive layer in contact with the first insulating substrate,
wherein the second surface of the first conductive layer includes an exposed surface of the first conductive layer that is exposed within a region located outside the position of the end surface of the adhesive layer,
wherein the exposed surface of the first conductive layer, the end surface of the adhesive layer, and the main surface of the second insulating substrate are arranged to surround an external space from three directions, and
wherein a distance from the end part of the adhesive layer to the end part of the second insulating substrate is 10 [μm] or more and 500 [μm] or less.

6. The printed wiring board according to claim 5, further comprising
a second conductive layer provided at another printed wiring board,
wherein the exposed surface of the first conductive layer is electrically connected to the second conductive layer.

7. The printed wiring board according to claim 6, wherein an anisotropic conductive layer is disposed in an interspace between the first conductive layer and the second conductive layer, wherein the interspace includes the external space.

8. The printed wiring board according to claim 7, wherein an anisotropic conductive layer is disposed between the first conductive layer and the second conductive layer.

* * * * *